US006998326B2

(12) United States Patent
Kim

(10) Patent No.: US 6,998,326 B2
(45) Date of Patent: Feb. 14, 2006

(54) METHOD FOR MANUFACTURING SHALLOW TRENCH ISOLATION IN SEMICONDUCTOR DEVICE

(75) Inventor: Jae-Hong Kim, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 162 days.

(21) Appl. No.: 10/735,913

(22) Filed: Dec. 16, 2003

(65) Prior Publication Data

US 2004/0266133 A1 Dec. 30, 2004

(30) Foreign Application Priority Data

Jun. 30, 2003 (KR) ..................... 10-2003-0043145

(51) Int. Cl.
*H01L 21/76* (2006.01)
*H01L 21/469* (2006.01)

(52) U.S. Cl. ..................... 438/424; 438/435; 438/437; 438/770; 438/773

(58) Field of Classification Search ................ 438/424, 438/435, 437, 770, 773
See application file for complete search history.

(56) References Cited

U.S. PATENT DOCUMENTS 6,261,975 B1 7/2001 Xia et al.
6,387,764 B1 5/2002 Curtis et al.
6,660,613 B1 * 12/2003 Kim et al. .................. 438/424
6,849,520 B1 * 2/2005 Kim et al. .................. 438/424
2003/0045070 A1 * 3/2003 Kim et al. .................. 438/424
2004/0082143 A1 * 4/2004 Kim et al. .................. 438/424

* cited by examiner

*Primary Examiner*—Craig A. Thompson
(74) *Attorney, Agent, or Firm*—Mayer, Brown, Rowe & Maw LLP

(57) ABSTRACT

The method for manufacturing a shallow trench isolation (STI) in a semiconductor device with an enhanced gap-fill property and without a detrimental effect of fluorine by introducing a two-stage thermal process. The method includes steps of: preparing a semiconductor substrate obtained by a predetermined process on which a pad oxide and a pad nitride are formed on predetermined locations thereof; forming a trench structure in the semiconductor substrate; forming a hydrogen ($H_2$)-based high density plasma (HDP) oxide layer over a first resultant structure; forming a nitrogen trifluoride ($NF_3$)-based HDP oxide layer into the trench structure with a predetermined depth; carrying out a two-stage thermal process for removing fluorine in the $NF_3$-based HDP oxide layer; and forming a helium (He)-based HDP oxide layer over a second resultant structure.

22 Claims, 6 Drawing Sheets

METHOD FOR MANUFACTURING SHALLOW TRENCH ISOLATION IN SEMICONDUCTOR DEVICE

FIELD OF THE INVENTION

The present invention relates to a method for manufacturing a semiconductor device; and, more particularly, to a method for manufacturing a shallow trench isolation (STI) for use in a highly integrated semiconductor device with an enhanced gap-fill property and simultaneously, without a detrimental impact of fluorine by employing a two-stage thermal process.

DESCRIPTION OF THE PRIOR ART

As is well known, in a semiconductor device, there is formed an isolation region for electrically isolating elements from each other. In order to form the isolation region, various techniques have been employed such as a local oxidation of silicon (LOCOS) which uses a thermal oxide or a shallow trench isolation (STI) technique which is suitable for a highly integrated semiconductor device.

The LOCOS technique, however, has several drawbacks that a field oxide (FOX) is deteriorated with a decrease of a design rule and further, a bird's beak structure encroached into an active area of the device. Thus, the LOCOS technique is rarely employed to form the isolation region as the device becomes micro-miniaturized in nowadays.

To overcome the disadvantage of the LOCOS technique, the STI has been popularly used for a nano-miniaturized device. That is, as the device becomes micro-miniaturized, an effective area of the active region is also reduced by degrees. Therefore, in order to fill the trench having a high aspect ratio with an insulating material, a high density plasma (HDP) oxide has been greatly utilized because it shows good step coverage. In particular, the HDP oxide is referred to as a helium (He)-based HDP oxide because the HDP oxide is formed conventionally by using a source gas including a silane ($SiH_4$) gas, an oxygen ($O_2$) gas and a helium (He) gas. However, there is still a limitation to apply the conventional He-based HDP oxide for forming the STI in the micro-miniaturized semiconductor device.

That is, in the STI process for use in an 80 nm scale nano-device, the minimum aspect ratio for securing a trench gap-fill is about 5 but the He-based HDP oxide can be used for forming the trench having only the aspect ratio below about 4. Therefore, in case of using the He-based HDP oxide for the STI, there are inevitably happened micro-voids therein.

In attempt to overcome this limitation of the He-based HDP oxide, there is proposed a method for forming the HDP oxide by flowing a nitrogen trifluoride ($NF_3$) into the exemplary source gas of $SiH_4$ gas, $O_2$ gas and He gas, which is carried out through three steps. Among the steps, a first and a second steps are very important steps for filling the HDP oxide uniformly into the trench without any void therein.

Referring to FIGS. 1A to 1C, there are provided cross sectional views setting forth a conventional method for manufacturing the STI by using an $NF_3$-based HDP oxide.

In FIG. 1A, a process for manufacturing the STI begins with preparing a semiconductor substrate 110 obtained by a predetermined process. Afterward, a pad oxide layer and a pad nitride layer are formed on the semiconductor substrate 110 in sequence. Then, photoresist masks (not shown) are formed on predetermined locations of a top face of the pad nitride layer. Thereafter, the pad nitride layer and the pad oxide layer are patterned into a first predetermined configuration by using the photoresist masks as mask patterns till a top face of the semiconductor substrate 110 is exposed, thereby forming a pad oxide 112 and a pad nitride 114 on the semiconductor substrate 110. Subsequently, the photoresist masks are removed by using a typical method such a photostrip process or the like.

Following the removal of the photoresist masks, the semiconductor substrate 110 is patterned into a second predetermined configuration by using the pad nitride 114 as an etch mask so as to form a trench structure therein. Afterward, a sidewall oxide layer (not shown) is formed on sidewalls of the trench structure for compensating damage produced during above etching process and removing dangling bonds existing in the trench structure.

In a subsequent step, a liner nitride 116 is formed over the resultant structure. Herein, the liner nitride 116 plays a role in reducing stress concentrated into edges and the sidewalls of the trench structure and also preventing the sidewalls of the trench structure from being oxidized during a post oxidation process.

Thereafter, a liner oxide 118 is formed on the liner nitride 116 for preventing the liner nitride 116 from being lifted up due to an excessive stress incurred during a post process for filling the trench structure with an insulating material.

After forming the liner oxide 118, a first high density plasma (HDP) oxide layer, i.e., a hydrogen ($H_2$)-based HDP oxide layer 120, is deposited on the liner oxide 118 with a predetermined thickness. That is, the $H_2$-based HDP oxide layer 120 is formed by adding $H_2$ gas to an exemplary source gas of $SiH_4$ gas, $O_2$ gas and He gas for improving a step coverage.

Following the formation of the $H_2$-based HDP oxide layer 120, a second HDP oxide layer, i.e., a $NF_3$-based HDP oxide layer 122 is formed partially in the trench structure and partially on the $H_2$-based HDP oxide layer 120 over the pad nitride 114. The $NF_3$-based HDP oxide layer 122 is formed by adding $NF_3$ gas to the exemplary source gas of $SiH_4$ gas, $O_2$ gas and He gas, for providing a good gap-fill property. Since the $NF_3$ gas serves as a chemical etchant during the deposition process, it is possible to prevent an unnecessary deposition on the sidewalls of the trench such as a re-deposition phenomenon during a sputtering process. Moreover, the $NF_3$-based HDP oxide layer 122 is thickly formed on the bottom of the trench structure as the deposition process is performed more and more. On the contrary, the $NF_3$-based HDP oxide layer 122 is rarely formed on the sidewalls of the trench structure. Therefore, the $NF_3$-based HDP oxide layer 122 can be uniformly formed into the trench structure having a high aspect ratio without micro-voids therein, thereby securing a good gap-fill property.

Referring to FIG. 1C, after the formation of the $NF_3$-based HDP oxide layer 122, the He-based HDP oxide layer 124 is deposited over the resultant structure by using an exemplary source gas of $SiH_4$ gas, $O_2$ gas and He gas. Thereafter, the He-based HDP oxide layer 124 is planarized by using a method such as a chemical mechanical polishing (CMP) or the like. After removing the pad nitride 114, the conventional method for manufacturing the STI is completed.

According to the conventional method, it provides a good gap-fill property when the HDP oxide is formed by using the source gas containing $NF_3$ gas. But, since there exists a fluorine (F) in the $NF_3$-based HDP oxide layer 122, the fluorine has a detrimental effect on a gate oxide during a post thermal process. Therefore, it is difficult to expect a reliable semiconductor device in the long run.

SUMMARY OF THE INVENTION

It is, therefore, an object of the present invention to provide a method for manufacturing a shallow trench isolation (STI) in a semiconductor device with an enhanced gap-fill property and without a detrimental effect of fluorine by employing a two-stage thermal process.

In accordance with one aspect of the present invention, there is provided a method for manufacturing an STI in a semiconductor device, the method including the steps of: a) preparing a semiconductor substrate obtained by a predetermined process on which a pad oxide and a pad nitride are formed on predetermined locations thereof; b) forming a trench structure in the semiconductor substrate; c) forming a hydrogen ($H_2$)-based high density plasma (HDP) oxide layer over a first resultant structure; d) forming a nitrogen trifluoride ($NF_3$)-based HDP oxide layer into the trench structure with a predetermined depth; e) carrying out a two-stage thermal process for removing fluorine in the $NF_3$-based HDP oxide layer; and f) forming a helium (He)-based HDP oxide layer over a second resultant structure.

In accordance with another aspect of the present invention, there is provided a method for manufacturing an STI in a semiconductor device, the method including the steps of: a) preparing a semiconductor substrate obtained by a predetermined process on which a pad oxide and a pad nitride are formed on predetermined locations thereof; b) forming a trench structure in the semiconductor substrate; c) forming a hydrogen ($H_2$)-based high density plasma (HDP) oxide layer over a first resultant structure; d) forming a nitrogen trifluoride ($NF_3$)-based HDP oxide layer into the trench structure with a predetermined depth; e) forming a helium (He)-based HDP oxide layer over a second resultant structure; and f) carrying out a two-stage thermal process for removing fluorine in the $NF_3$-based HDP oxide layer.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1A:
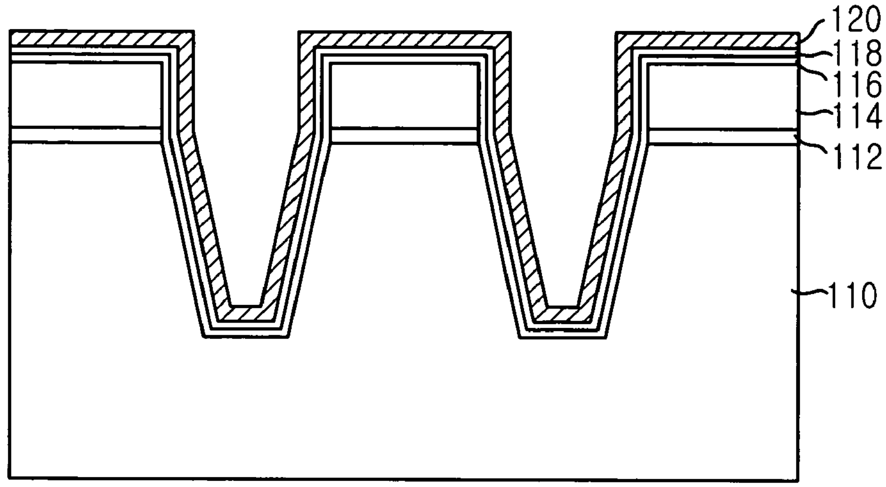
FIGS. 1A to 1C are cross sectional views setting forth a conventional method for manufacturing a shallow trench isolation (STI) in a semiconductor device.
Figure 1B:
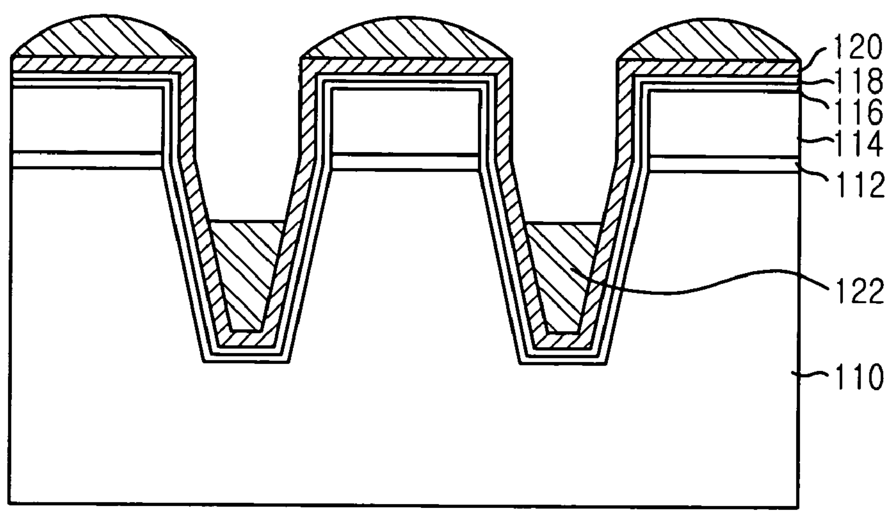
Figure 1C:
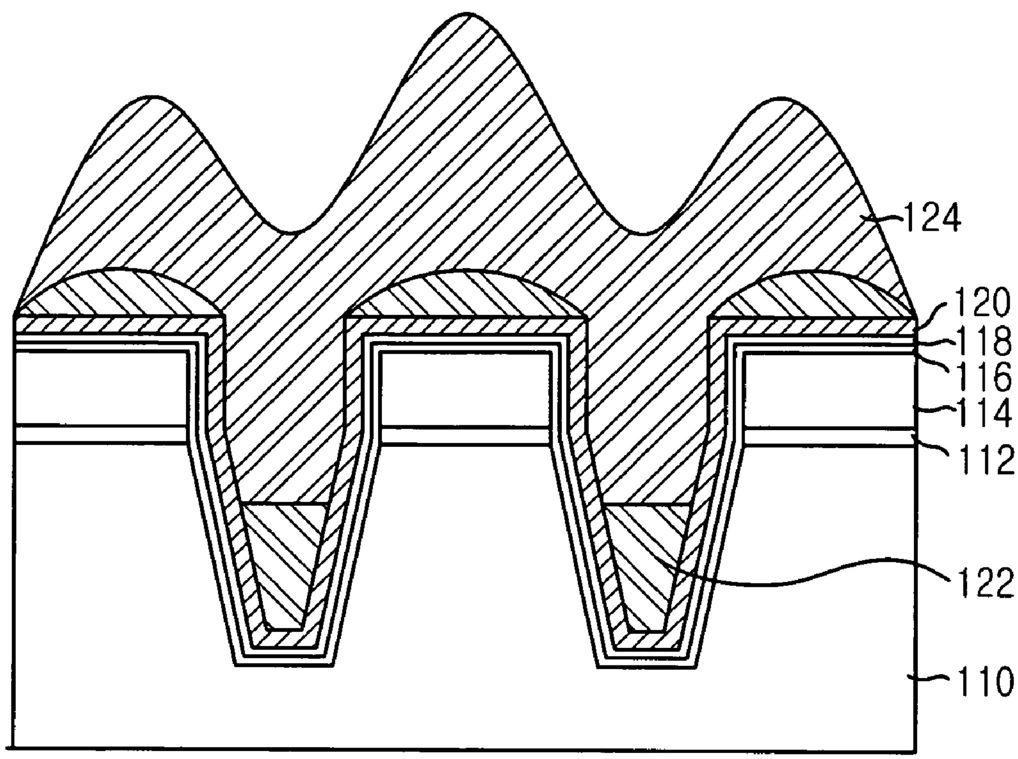

There are provided in FIGS. 2A to 2C and FIGS. 3A and 3B cross sectional views setting forth a method for manufacturing a shallow trench isolation (STI) in a semiconductor device in accordance with a preferred embodiment of the present invention. It should be noted that like parts appearing in FIGS. 2A to 2C and FIGS. 3A and 3B are represented by like reference numerals.

Figure 2A:
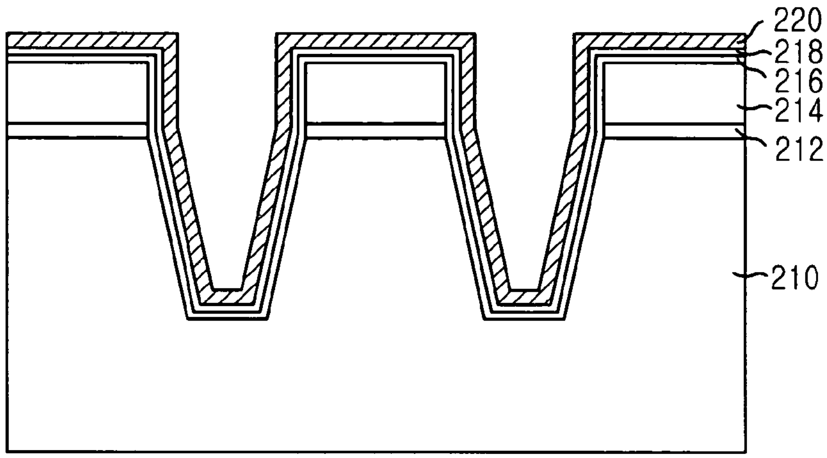
FIGS. 2A to 2D are cross sectional views illustrating a method for manufacturing an STI in a semiconductor device in accordance with a preferred embodiment of the present invention.

Referring to FIG. 2A, a process for manufacturing the STI in the semiconductor device begins with preparing a semiconductor substrate 210 obtained by a predetermined process. Afterward, a pad oxide layer and a pad nitride layer are formed on the semiconductor substrate 210 in sequence. Then, photoresist masks (not shown) are formed on predetermined locations of a top face of the pad nitride layer. Thereafter, the pad nitride layer and the pad oxide layer are patterned into a first predetermined configuration by using the photoresist masks as mask patterns till a top face of the semiconductor substrate 210 is exposed, thereby forming a pad oxide 212 and a pad nitride 214 on the semiconductor substrate 210. Subsequently, the photoresist masks are removed by using a typical method such a photostrip process.

Following the removal of the photoresist masks, the semiconductor substrate 210 is patterned into a second predetermined configuration by using the pad nitride 214 as an etch mask so as to form a trench structure therein. Afterward, a sidewall oxide layer (not shown) is formed on sidewalls of the trench structure for compensating damage produced during above etching process and removing dangling bonds existing in the trench structure.

In a subsequent step, a liner nitride 216 is formed over the resultant structure. Herein, the liner nitride 216 plays a role in reducing a stress concentrated into edges and the sidewalls of the trench structure and also preventing the sidewalls of the trench structure from being oxidized during a post oxidation process.

Thereafter, a liner oxide 218 is formed on the liner nitride 216 for preventing the liner nitride 216 from being lifted up due to an excessive stress incurred during a post process for filling the trench structure with an insulating material.

After forming the liner oxide 218, a first high density plasma (HDP) oxide layer, i.e., a hydrogen ($H_2$)-based HDP oxide layer 220, is deposited on the liner oxide 218 with a predetermined thickness. That is, the $H_2$-based HDP oxide layer 220 is formed by adding $H_2$ gas to an exemplary source gas for use in a conventional method for depositing a helium (He)-based HDP oxide layer, wherein the exemplary sources gas includes silane ($SiH_4$) gas, oxygen ($O_2$) gas and He gas. Herein, the purpose of adding $H_2$ gas to the exemplary source gas is to enhance a step coverage of the device. It is preferable that a flow rate of $SiH_4$ gas, $O_2$ gas, He gas and $H_2$ gas should be in the range of about 40 sccm to about 50 sccm, of about 50 sccm to about 60 sccm, of about 400 sccm to about 600 sccm and of about 50 sccm to about 150 sccm, respectively. Thus, it is possible to improve the step coverage while maintaining a low deposition rate. It is noted that the above flow rate should be determined in consideration of a trench profile, a critical dimension of a space, a depth of the trench and so forth.

In order to maintain the low deposition rate during the formation of the $H_2$-based HDP oxide layer 220, a low frequency (LF) power is supplied in the range of about 3,000 W to about 3,500 W and a high frequency (HF) power is supplied in the range of about 400 W to about 600 W.

Following the formation of the $H_2$-based HDP oxide layer 220, a second HDP oxide layer, i.e., a nitrogen trifluoride ($NF_3$)-based HDP oxide layer 222 is formed partially in the trench structure and partially on the $H_2$-based oxide layer 220 over the pad nitride 214. Herein, the $NF_3$-based HDP oxide layer 222 is formed by adding $NF_3$ gas to the exemplary source gas of $SiH_4$ gas, $O_2$ gas and He gas, for securing a good gap-fill property. It is important that the deposition process of the $NF_3$-based HDP oxide layer 222 should be carried out to maximize the deposition rate in a bottom area of the trench and to minimize the deposition rate in the sidewalls of the trench. Thus, in order to satisfy the above conditions, it is preferable that the flow rate of $SiH_4$ gas, $O_2$ gas, He gas and $NF_3$ gas should be in the range of about 50 sccm to about 70 scam, of about 100 scam to about 150 scam, of about 40 scam to about 60 scam and of about 20 scam to about 80 scam, respectively. Furthermore, it is preferable that the LF power should be supplied in the range of about 4,000 W to about 6,000 W and the HF power should be supplied in the range of about 900 W to about 1,000 W.

Since the $NF_3$ gas serves as a chemical etchant during the deposition process, it is possible to prevent an unnecessary deposition on the sidewalls of the trench such as a re-deposition phenomenon during a sputtering process. Moreover, the $NF_3$-based HDP oxide layer 222 is thickly formed on the bottom of the trench as the deposition process is performed more and more. On the contrary, the $NF_3$-based HDP oxide layer 222 is rarely formed on the sidewalls of the trench. Therefore, the $NF_3$-based HDP oxide layer 222 can be uniformly formed in the trench structure having a high aspect ratio without micro-voids therein. Herein, it is noted that a top surface of the $NF_3$-based HDP oxide layer 222 should be lower than that of the trench structure for preventing the $NF_3$-based HDP oxide layer 222 from being exposed after a chemical mechanical polishing (CMP) or a cleaning process. Although a concentration of fluorine (F) in the $NF_3$-based HDP oxide layer 222 is smaller than that of fluorine in a fluorine-doped silicate glass (FSG) which is commonly used for an interlayer dielectric, fluorine in the $NF_3$-based HDP oxide layer 222 still has a detrimental effect on a gate oxide in a post process.

In order to remove fluorine in the $NF_3$-based HDP oxide layer 222 in the present invention, therefore, a two-stage thermal process is carried out. A detailed description of carrying out the two-stage thermal process will be illustrated hereinafter.

Figure 3A:
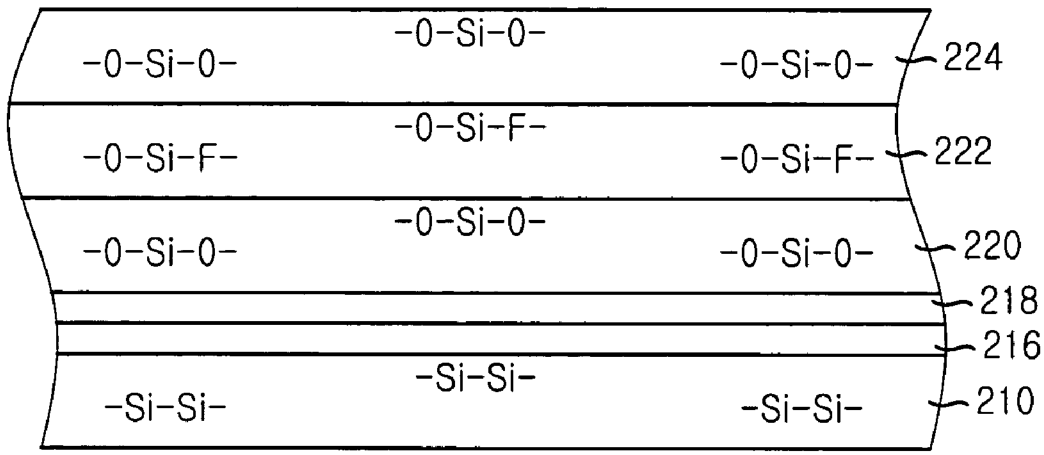
FIGS. 3A and 3B are cross sectional views depicting states of covalent bonds of silicon existing in each layer formed before and after carrying out a two-stage thermal process in accordance with the preferred embodiment of the present invention.
Figure 3B:
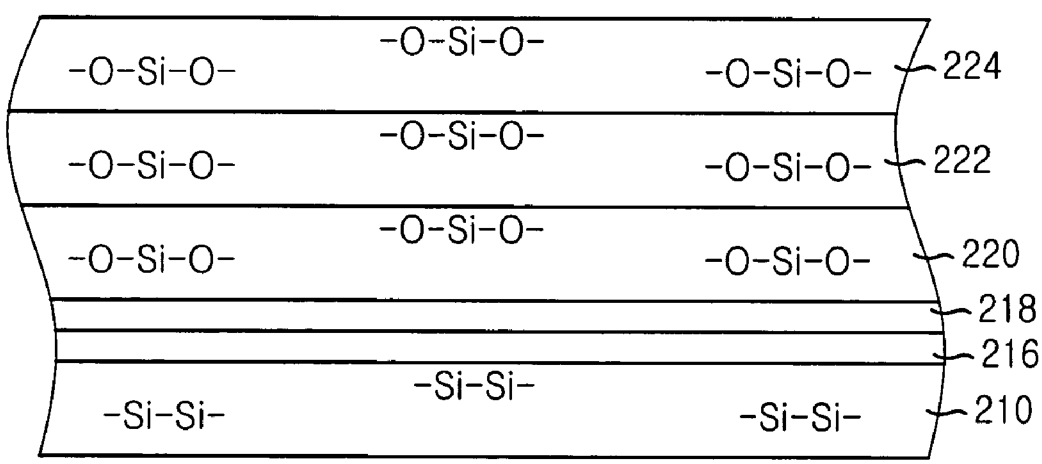

Referring to FIGS. 3A and 3B, there are schematic cross sectional views setting forth depicting states of covalent bonds of silicon existing in each layer formed before and after carrying out a two-stage thermal process in accordance with the preferred embodiment of the present invention.

In FIG. 3A, there are shown representative covalent bonds of silicon existing in the layers before carrying out the two-stage thermal process. It is understood that whole the layers except the $NF_3$-based HDP oxide layer 222 has mainly Si—O covalent bond but the $NF_3$-based HDP oxide layer 222 has Si—F covalent bond therein. The fluorine in Si—F covalent bond is dissociated during a post thermal process so that fluorine may diffuse into the gate oxide. In the result, the gate oxide may be deteriorated at last as describe already.

Figure 2B:
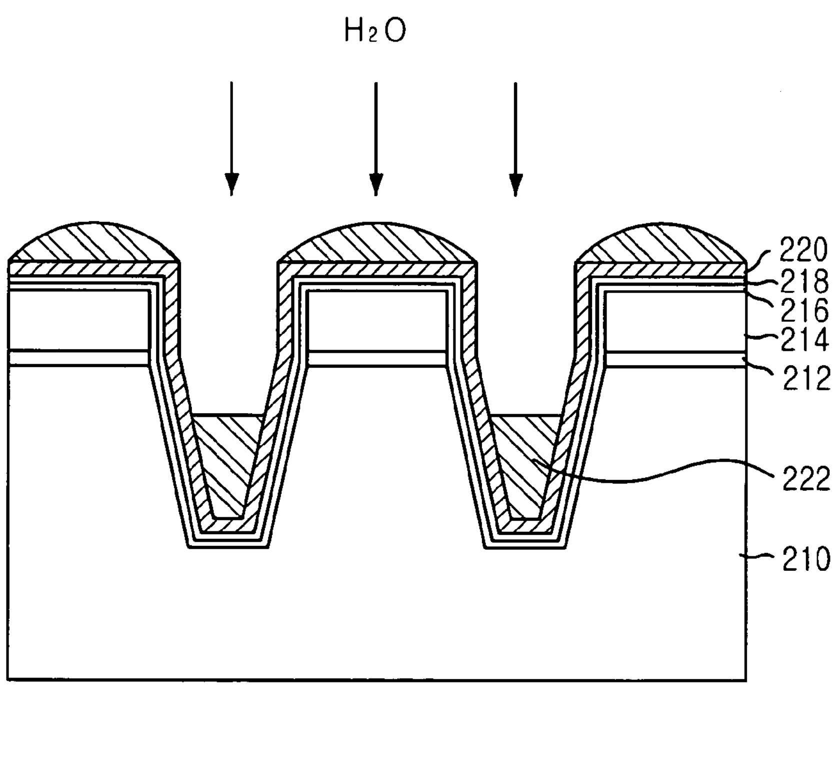

To overcome the above problem, referring to FIG. 2B, a first-stage thermal process is carried out in $H_2O$ ambient for about 30 minutes to about 10 hours at a temperature ranging from about 700° C. to about 1,100° C. in a diffusion furnace. During the first-stage thermal process, $H_2O$ molecules are penetrated into the $NF_3$-based HDP oxide layer 222 so that the $H_2O$ molecules react with Si—F covalent bond. This chemical reaction results in producing Si—OH bond and gaseous state of HF, wherein the gaseous state of HF is removed from the $NF_3$-based HDP oxide layer 222. The chemical reaction is depicted as followings.

$$\text{Si—F} + H_2O \Rightarrow \text{Si—OH} + HF\uparrow \qquad \text{[Eq. 1]}$$

Figure 2C:
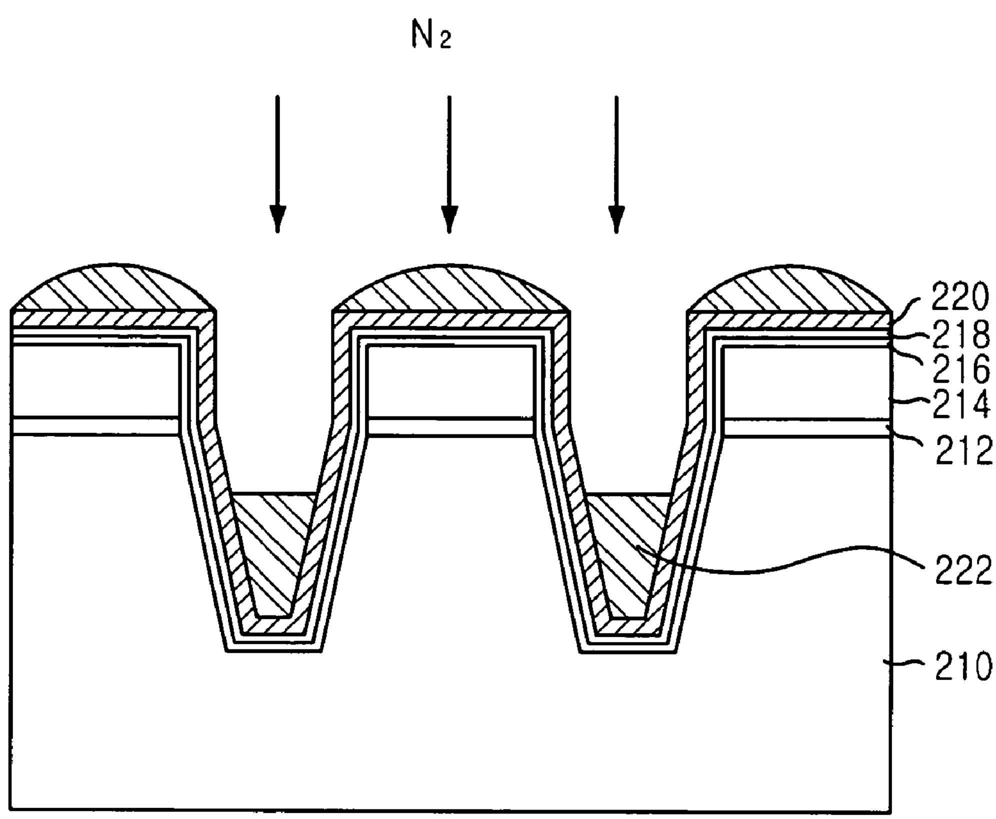

After carrying out the first-stage thermal process, referring to FIG. 2C, a second-stage thermal process is carried out in a nitrogen ($N_2$) gas ambient for about 30 minutes to about 10 hours at the temperature ranging from about 700° C. to about 1,100° C.

During the second-stage thermal process, a hydrolysis reaction occurs so that Si—OH bond reacts with adjacent Si—OH bond to produce a byproduct of $H_2O$. The chemical reaction of the second-stage thermal process is described as followings.

$$\text{Si—OH} + \text{Si—OH} \Rightarrow \text{Si—O—Si} + H_2O\uparrow \qquad \text{[Eq. 2]}$$

Therefore, after carrying out the second-stage thermal process, only Si—O covalent bonds exist in the $NF_3$-based HDP oxide layer 222. Thus, it is possible to remove fluorine remaining in the $NF_3$-based HDP oxide layer 222 effectively as shown in FIG. 3B. In the above description, the two-stage thermal process is carried out after forming the $NF_3$-based HDP oxide layer 222. Alternatively, the two-stage thermal process can be carried out after a post process for forming an He-based HDP oxide layer 224. In this case, the aforementioned results are also achieved.

Figure 2D:
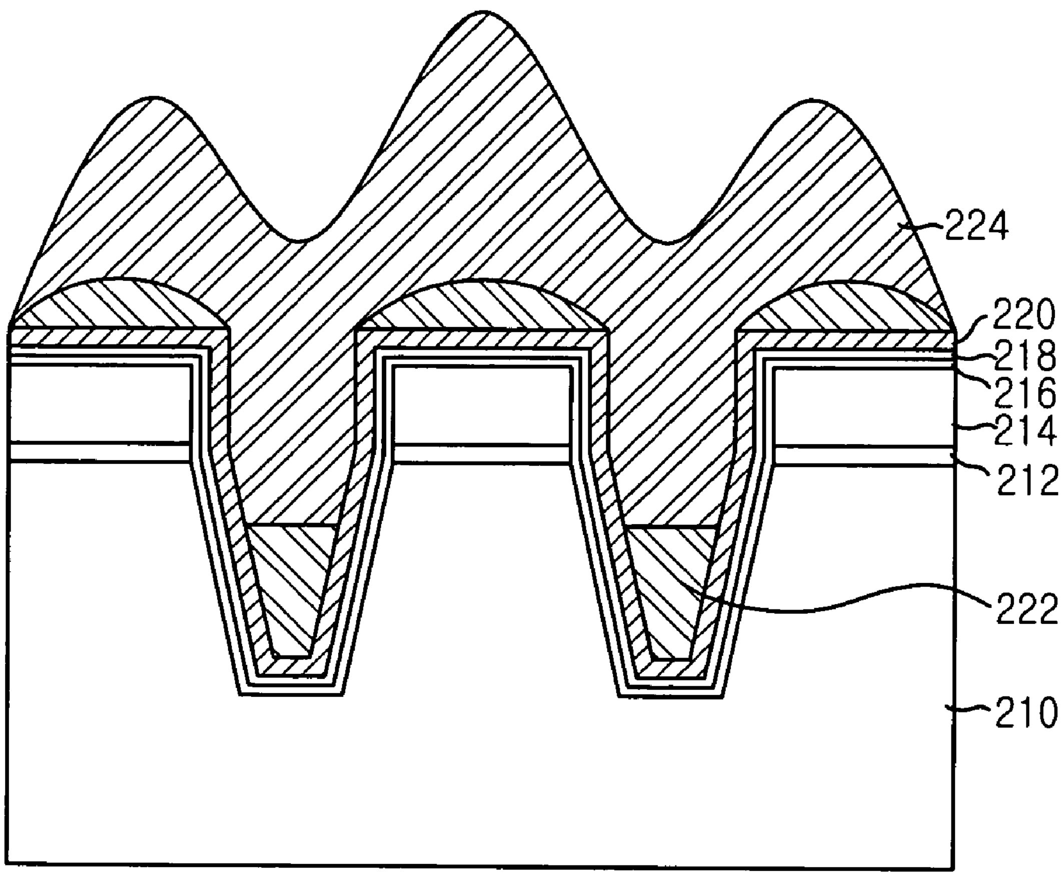

Referring to FIG. 2D, after the formation of the $NF_3$-based HDP oxide layer 222, the He-based HDP oxide layer 224 is deposited over the resultant structure by using the exemplary source gas of $SiH_4$ gas, $O_2$ gas and He gas. In forming the He-based HDP oxide layer 224, it is preferable that the flow rate of $SiH_4$ gas, $O_2$ gas and He gas should be in the range of about 150 sccm to about 250 sccm, of about 300 sccm to about 400 sccm and of about 400 sccm to about 600 sccm, respectively. The He-based HDP oxide layer 224 is conventionally used for forming the trench isolation. Accordingly, it is unnecessary to modify the post CMP process and the post cleaning process in the present invention. Since the process for forming the He-based HDP oxide layer 224 is well known to those in the art, further detail descriptions will be abbreviated herein.

As described above, the inventive method for forming the STI in the semiconductor device employs the two-stage thermal process of which the first-stage thermal process is carried out in $H_2O$ ambient and the second-stage thermal process is carried out in $N_2$ gas ambient. Therefore, the inventive method can be applied to the semiconductor device with a design rule of below 80 nm because it ensures the device with an enhanced gap-fill property and without the detrimental effect of fluorine.

While the present invention has been described with respect to the particular embodiments, it will be apparent to those skilled in the art that various changes and modifications may be made without departing from the scope of the invention as defined in the following claims.

What is claimed is:

1. A method for manufacturing a shallow trench isolation (STI) in a semiconductor device, the method comprising the steps of:

a) preparing a semiconductor substrate obtained by a predetermined process on which a pad oxide and a pad nitride are formed on predetermined locations thereof;

b) forming a trench structure in the semiconductor substrate;

c) forming a hydrogen ($H_2$)-based high density plasma (HDP) oxide layer over a first resultant structure;

d) forming a nitrogen trifluoride ($NF_3$)-based HDP oxide layer into the trench structure with a predetermined depth;

e) carrying out a two-stage thermal process for removing fluorine in the $NF_3$-based HDP oxide layer; and f) forming a helium (He)-based HDP oxide layer over a second resultant structure.

2. The method as recited in claim 1, wherein the step e) includes the steps of:

e1) carrying out a first-stage thermal process in an $H_2O$ ambient furnace; and e2) carrying out a second-stage thermal process in a nitrogen ($N_2$) gas ambient furnace.

3. The method as recited in claim 2, wherein the step e1) and the step e2) are carried out by using a diffusion furnace.

4. The method as recited in claim 3, wherein the step e1) and the step e2) are carried out for about 30 minutes to about 10 hours at a temperature ranging from about 700° C. to about 1,100° C.

5. The method as recited in claim 1, wherein the step b) includes the steps of:

b1) patterning the semiconductor substrate by using the pad nitride as a mask;

b2) forming a liner nitride on a bottom and sidewalls of the trench structure and portions of the semiconductor substrate; and b3) forming a liner oxide on the nitride layer.

6. The method as recited in claim 1, wherein the step c) is carried out by using a source gas having a silane ($SiH_4$) gas, an oxygen gas ($O_2$), a helium gas and an $H_2$ gas, wherein the flow rates of the $SiH_4$ gas, the $O_2$ gas, the He gas and the $H_2$ gas are in the range of about 40 sccm to about 50 sccm, of about 50 sccm to about 60 sccm, of about 400 sccm to about 600 sccm and of about 50 sccm to about 150 sccm, respectively.

7. The method as recited in claim 6, wherein the step c) is carried out on conditions that a low frequency (LF) power is supplied in the range of about 3,000 W to about 3,500 W and a high frequency (HF) power is supplied in the range of about 400 W to about 600 W.

8. The method as recited in claim 1, wherein the step d) is carried out by using a source gas having the $SiH_4$ gas, the $O_2$ gas, the He gas and the $NF_3$ gas, wherein the flow rates of the $SiH_4$ gas, the $O_2$ gas, the He gas and the $NF_3$ gas are in the range of about 50 sccm to about 70 sccm, of about 100 sccm to about 150 sccm, of about 40 sccm to about 60 sccm and of about 20 sccm to about 80 sccm, respectively.

9. The method as recited in claim 8, wherein the step d) is carried out on conditions that the LF power is supplied in the range of about 4,000 W to about 6,000 W and the HF power is supplied in the range of about 900 W to about 1,000 W.

10. The method as recited in claim 1, wherein a top face of the $NF_3$-based HDP oxide layer is lower than the top face of the trench structure.

11. The method as recited in claim 1, wherein the step f) is carried out by using a source gas having the $SiH_4$ gas, the $O_2$ gas and the He gas, wherein the flow rates of the $SiH_4$ gas, the $O_2$ gas and the He gas are in the range of about 150 sccm to about 250 sccm, of about 300 sccm to about 400 sccm and of about 400 sccm to about 600 sccm, respectively.

12. A method for manufacturing an STI in a semiconductor device, the method comprising the steps of:

a) preparing a semiconductor substrate obtained by a predetermined process on which a pad oxide and a pad nitride are formed on predetermined locations thereof;

b) forming a trench structure in the semiconductor substrate;

c) forming an $H_2$-based HDP oxide layer over a first resultant structure;

d) forming an $NF_3$-based HDP oxide layer into the trench structure with a predetermined depth;

e) forming a He-based HDP oxide layer over a second resultant structure; and f) carrying out a two-stage thermal process for removing fluorine in the $NF_3$-based HDP oxide layer.

13. The method as recited in claim 12, wherein the step f) includes the steps of:

f1) carrying out a first-stage thermal process in an $H_2O$ ambient furnace; and f2) carrying out a second-stage thermal process in an $N_2$ gas ambient furnace.

14. The method as recited in claim 13, wherein the step f1) and the step f2) are carried out by using a diffusion furnace.

15. The method as recited in claim 14, wherein the step f1) and the step f2) are carried out for about 30 minutes to about 10 hours at a temperature ranging from about 700° C. to about 1,100° C.

16. The method as recited in claim 12, wherein the step b) includes the steps of:

b1) patterning the semiconductor substrate by using the pad nitride as a mask;

b2) forming a liner nitride on a bottom and sidewalls of the trench structure and portions of the semiconductor substrate; and b3) forming a liner oxide on the nitride layer.

17. The method as recited in claim 12, wherein the step c) is carried out by using a source gas having an $SiH_4$ gas, an $O_2$ gas an He gas and an $H_2$ gas, wherein the flow rates of the $SiH_4$ gas, the $O_2$ gas, the He gas and the $H_2$ gas are in the range of about 40 sccm to about 50 sccm, of about 50 sccm to about 60 sccm, of about 400 sccm to about 600 sccm and of about 50 sccm to about 150 sccm, respectively.

18. The method as recited in claim 17, wherein the step c) is carried out on conditions that a low frequency (LF) power is supplied in the range of about 3,000 W to about 3,500 W and a high frequency (HF) power is supplied in the range of about 400 W to about 600 W.

19. The method as recited in claim 12, wherein the step d) is carried out by using a source gas having the $SiH_4$ gas, the $O_2$ gas, the He gas and the $NF_3$ gas, wherein the flow rates of the $SiH_4$ gas, the $O_2$ gas, the He gas and the $NF_3$ gas are in the range of about 50 sccm to about 70 sccm, of about 100 sccm to about 150 sccm, of about 40 sccm to about 60 sccm and of about 20 sccm to about 80 sccm, respectively.

20. The method as recited in claim 19, wherein the step d) is carried out on conditions that the LF power is supplied in the range of about 4,000 W to about 6,000 W and the HF power is supplied in the range of about 900 W to about 1,000 W.

21. The method as recited in claim 12, wherein a top face of the $NF_3$-based HDP oxide layer is lower than the top face of the trench structure.

22. The method as recited in claim 12, wherein the step e) is carried out by using a source gas having the $SiH_4$ gas, the $O_2$ gas and the He gas, wherein the flow rates of the $SiH_4$ gas, the $O_2$ gas and the He gas are in the range of about 150 sccm to about 250 sccm, of about 300 sccm to about 400 sccm and of about 400 sccm to about 600 sccm, respectively.

* * * * *